US008489348B2

(12) United States Patent
Shirriff et al.

(10) Patent No.: US 8,489,348 B2
(45) Date of Patent: Jul. 16, 2013

(54) AGGREGATING MOBILE DEVICE BATTERY LIFE DATA

(75) Inventors: Ken Shirriff, Redwood City, CA (US); Dan Egnor, Palo Alto, CA (US); Jason Parks, Santa Clara, CA (US)

(73) Assignee: Google Inc., Mountain View, CA (US)

( * ) Notice: Subject to any disclaimer, the term of this patent is extended or adjusted under 35 U.S.C. 154(b) by 341 days.

(21) Appl. No.: 12/792,637

(22) Filed: Jun. 2, 2010

(65) Prior Publication Data

US 2011/0301890 A1    Dec. 8, 2011

(51) Int. Cl.
  *G01R 31/36*   (2006.01)
  *H02J 7/00*    (2006.01)
  *G08B 21/00*   (2006.01)

(52) U.S. Cl.
  USPC .......................... 702/63; 320/134; 340/636.1

(58) Field of Classification Search
  USPC ................. 702/63, 57, 60, 64–68, 70–71, 81,
      702/84, 127, 179–183, 187–189; 703/2, 4,
      703/18, 20–22; 320/134, 136; 340/636.1,
      340/636.19; 455/67.11, 343.1–343.6, 423;
      700/9, 28–32, 108–109, 286, 291; 709/202–203,
      709/218, 224; 713/340
  See application file for complete search history.

(56) References Cited

U.S. PATENT DOCUMENTS

| 2007/0155441 A1 | 7/2007 | Carbonaro |
| 2008/0136654 A1 | 6/2008 | Toriello et al. |
| 2009/0183157 A1 | 7/2009 | Tran et al. |
| 2009/0207767 A1 | 8/2009 | Hirsch |
| 2009/0248878 A1 | 10/2009 | Tran et al. |
| 2009/0327491 A1 | 12/2009 | Tran et al. |
| 2010/0001870 A1 | 1/2010 | Hong et al. |
| 2010/0274507 A1 | 10/2010 | Black et al. |
| 2012/0022818 A1* | 1/2012 | Shirriff et al. ................... 702/63 |

OTHER PUBLICATIONS

Shye et al., Into the Wild: Studying Real User Activity Patterns to Guide Power Optimizations for Mobile Architectures, Dec. 12-16, 2009, MICRO '09, pp. 168-178.*
Response to Office Action dated May 3, 2012, from U.S. Appl. No. 13/250,986, filed Jul. 3, 2012, 11 pp.
Office Action from U.S. Appl. No. 13/250,986, dated Nov. 25, 2011, 10 pgs.
Response to Office Action dated Nov. 25, 2011 from U.S. Appl. No. 13/250,986, filed Feb. 27, 2012, 9 pp.
Office Action from U.S. Appl. No. 13/250,986, dated May 3, 2012, 8 pp.
International Search Report and Written Opinion of International Application No. PCT/US2011/037955, dated Nov. 29, 2011, 8 pp.
PCT Application No. PCT/US2011/037955, by Ken Shirriff, filed May 25, 2011.
U.S. Appl. No. 13/250,986, by Ken Shirriff, filed Sep. 30, 2011.

(Continued)

*Primary Examiner* — Toan Le
(74) *Attorney, Agent, or Firm* — Shumaker & Sieffert, P.A.

(57) ABSTRACT

Battery life data may be collected from a number of mobile devices. The battery life data for each of the mobile devices may be correlated with one or more characteristics of each of the mobile devices. The battery life data for the mobile devices may be aggregated based on at least one of the one or more characteristics. In some examples, a report of the aggregated battery life data for the mobile devices including at least one common characteristic is generated.

21 Claims, 11 Drawing Sheets

OTHER PUBLICATIONS

Response to Office Action dated May 3, 2012 and the Advisory Action dated Jul. 11, 2012, from U.S. Appl. No. 13/250,986, filed Jul. 26, 2012, 11 pp.

Non-Final Office Action from U.S. Appl. No. 13/250,986, dated Dec. 11, 2012, 12 pp.

International Preliminary Report on Patentability and Written Opinion from international application No. PCT/US2011/037955, dated Dec. 13, 2012, 5 pp.

Office Action from U.S. Appl. No. 13/250,986, dated Dec. 11, 2012, filed Mar. 11, 2013, 15 pp.

* cited by examiner

AGGREGATING MOBILE DEVICE BATTERY LIFE DATA

TECHNICAL FIELD

This disclosure relates to mobile devices, and, in particular, to the battery lives of such devices.

BACKGROUND

Mobile devices provide the benefit of being portable while allowing a user to perform a variety of functions including various forms of communication and computing. For example, some mobile devices are capable of accessing the Internet, executing gaming applications, playing videos and music, as well as providing functionality of a traditional mobile, e.g. cellular, phone. As mobile devices are not tethered to a physical communication medium or stationary power source, such devices are generally powered by a rechargeable battery. A persistent challenge in mobile device design is increasing the length of time the device may operate without recharging the battery.

SUMMARY

In general, this disclosure is directed to techniques for aggregating battery life data for a number of mobile devices based on one or more characteristics of the devices. In one example, a method includes collecting battery life data from each of a plurality of mobile devices, correlating, by a computing device, the battery life data collected from each of the mobile devices with one or more characteristics of each of the mobile devices, and aggregating, by the computing device, the battery life data collected from each of the mobile devices based on at least one of the one or more characteristics.

In another example, a system includes a database configured to store battery life data collected from each of a plurality of mobile devices via a communication network, means for correlating the battery life data collected from each of the mobile devices with one or more characteristics of each of the mobile devices, and means for aggregating the battery life data collected from each of the mobile devices based on at least one of the one or more characteristics.

In another example, a computer readable storage medium includes instructions for causing a programmable processor to collect battery life data from each of a plurality of mobile devices, correlate the battery life data collected from each of the mobile devices with one or more characteristics of each of the mobile devices, and aggregate the battery life data collected from each of the mobile devices based on at least one of the one or more characteristics.

The details of one or more embodiments of the disclosure are set forth in the accompanying drawings and the description below. Other features, objects, and advantages of the disclosure will be apparent from the description and drawings, and from the claims.

DETAILED DESCRIPTION

A persistent challenge in mobile device design is the length of time the device may operate without recharging the battery, which is generally referred to in this disclosure as battery life. While in some examples battery life refers to a period of time between completely charging and discharging a battery of a mobile device, more generally, battery life refers to any period of time in which the charge level of a mobile device battery is depleted. The battery life of a mobile device depends on many factors. Generally speaking, battery life is affected by loads on the battery caused by using either software or hardware components of the mobile device. As different components, including hardware and software components, draw different amounts of power, the load on the battery may vary according to component usage patterns.

For example, a display backlight may draw more power than an accelerometer, such that the battery life of a mobile device including these components may decrease significantly with increased backlight usage, while being less impacted by increased usage of the accelerometer. In another example, one system software build for a mobile device may generally require more power than another system software build. More generally, battery life of a mobile device may depend on the particular hardware and software components of the device and the amount and pattern of software and hardware component usage.

In general, this disclosure is directed to techniques for collecting battery life for a large number of mobile devices (e.g., mobile phones), correlating that battery life data to different characteristics of the devices, and aggregating the battery life data based on the correlations. Understanding average battery life and battery life distributions for large sets of devices has a number of benefits including detecting software release regressions and particular usage patterns that significantly impact battery life, both of which may be used to improve battery life in future releases of a device.

Figure 1:
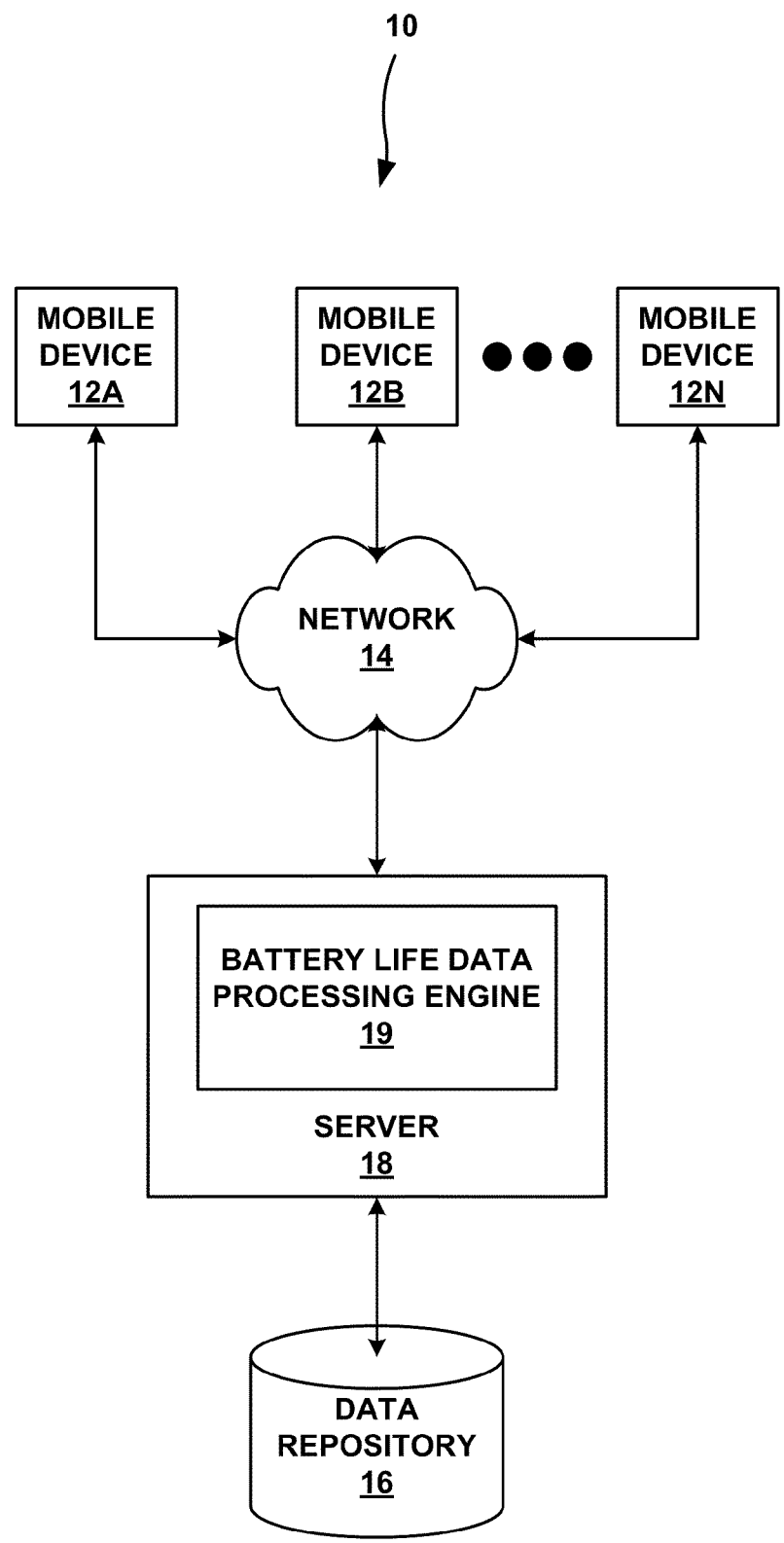
FIG. 1 is a block diagram illustrating an example system that may be used for aggregating battery life data from a number of mobile devices.

FIG. 1 is a block diagram illustrating example system 10 including mobile devices 12A-12N (collectively "mobile devices 12"), network 14, data repository 16, and server 18. Mobile devices 12 are communicatively connected to data repository 16 and server 18 via network 14. Mobile devices 12 and server 18 are configured to periodically communicate with one another over network 14 to collect battery life data and characteristics from the mobile devices in use by one or more different types of users.

Mobile devices 12 may include any number of different portable electronic mobile devices, including, e.g., cellular phones, personal digital assistants (PDAs), laptop computers, portable gaming devices, portable media players, e-book readers, watches, as well as non-portable devices such as desktop computers. Additionally, mobile devices 12 may be employed in the disclosed examples by different types of users, including, e.g., test users and consumers. Test users may include employees of the mobile device and/or software manufacturer collecting battery life data, while consumers may be the purchasers of the devices. In some examples, the type and amount of device data and usage patterns that is collected from mobile devices 12 by server 18 may depend on the type of user associated with a particular device or a number of devices. In any case, regardless of the type, system 10 may be configured such that users may opt-in or opt-out of an data collection from or data transmission to mobile devices 12. For example, a user of one of mobile devices 12 my opt-out of data collection on varying levels or completely by interacting with a user interface of the device, which may, in effect, disable the data collection feature on the user's device.

Network 14 may include one or more terrestrial and/or satellite networks interconnected to provide a means of communicatively connecting mobile devices 12 to data repository 16 and server 18. For example, network 14 may be a private or public local area network (LAN) or Wide Area Network (WANs). Network 14 may include both wired and wireless communications according to one or more standards and/or via one or more transport mediums. For example, network 14 may include wireless communications according to one of the 802.11 or Bluetooth specification sets, or another standard or proprietary wireless communication protocol. Network 14 may also include communications over a terrestrial cellular network, including, e.g. a GSM (Global System for Mobile Communications), CDMA (Code Division Multiple Access), EDGE (Enhanced Data for Global Evolution) network. Data transmitted over network 14, e.g., from mobile devices 12 to data repository 16 may be formatted in accordance with a variety of different communications protocols. For example, all or a portion of network 14 may be a packet-based, Internet Protocol (IP) network that communicates data from mobile devices 12 to data repository 16 in Transmission Control Protocol/Internet Protocol (TCP/IP) packets, over, e.g., Category 5, Ethernet cables.

Data repository 16 may include, e.g., a standard or proprietary database or other data storage and retrieval mechanism. Data repository 16 may be implemented in software, hardware, and combinations of both. For example, data repository 16 may include proprietary database software stored on one of a variety of storage mediums on a data storage server connected to network 14 and configured to collect battery life data from mobile devices. Storage medium included in or employed in cooperation with data repository 16 may include, e.g., any volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital media.

Server 18 includes battery life data processing engine 19, which may be employed, as described below, to process battery life data collected from mobile devices 12. Server 18 may be any of several different types of network devices. For example, server 18 may include a data processing appliance, web server, specialized media server, personal computer operating in a peer-to-peer fashion, or another type of network device. Additionally, although example system 10 of FIG. 1 includes one server 18, other examples may include a number of collocated or distributed servers configured to process battery life data collected from mobile devices 12 and stored in data repository 16 individually or in cooperation with one another.

Although data repository 16 and server 18 are illustrated as separate components in example system 10 of FIG. 1, in other examples the two components may be combined or may each be distributed amongst more than one device. For example, server 18 may store data repository 16 and control the repository to periodically store battery life data collected from mobile devices 12. In another example, data repository 16 may be distributed among a number of separate devices, e.g. a number of database servers, and server 18 may include a number of co-located or distributed servers configured to operate individually and/or in cooperation with one another and with the various devices comprising data repository 16.

Regardless of the particular configuration of system 10, or other example systems according to this disclosure, the system may be employed to collect battery life for a large number of mobile devices 12, correlate that battery life data to different characteristics of the mobile devices, and aggregate the battery life data based on the correlations. In one example, each of mobile devices 12 periodically logs battery life data as, e.g., the device battery is discharged by some increment (e.g. 1%). Battery life data processing engine 19 of server 18 includes a service for collecting battery life data from mobile devices 12 by which the server periodically contacts each of the mobile devices via network 14 and instructs the device to transmit battery life data, as well as other data including the model and software build of the device and various usage patterns, to data repository 16 for temporary and/or permanent storage of all or a part of the mobile device data.

Figure 2:
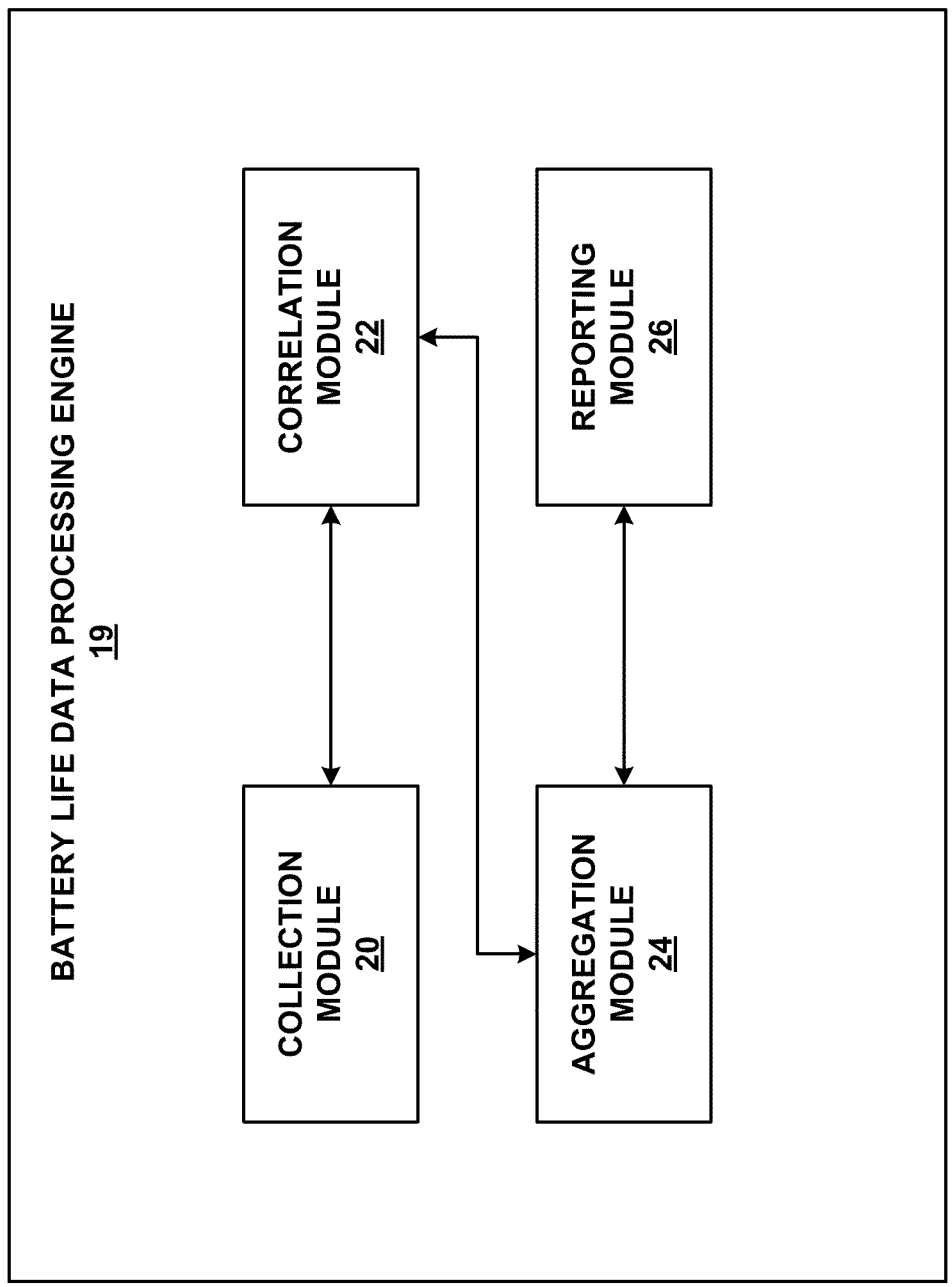
FIG. 2 is a block diagram illustrating an example battery life data processing engine of the system of FIG. 1.

For example, one example configuration of battery life data processing engine 19 is illustrated in FIG. 2, in which the data processing engine of server 18 includes battery life data collection module 20, correlation module 22, aggregation module 24, and reporting module 26. In the example of FIG. 2, battery life data collection module 20 of battery life data processing engine 19 may be configured to periodically contact each of mobile devices 12 via network 14 and instruct the devices to transmit battery life data to data repository 16. Although some of the disclosed examples are generally described as server 18 contacting mobile devices 12 to collect battery life data, in some examples, mobile devices 12 may be configured to automatically transmit battery life data to data repository 16, e.g. on a periodic basis without waiting for requests from server 18.

Battery life data communicated between mobile devices 12 and server 18, and, in particular, collection module 20 of battery life data processing engine 19, may be encapsulated in a variety of formats. For example, battery life data from mobile devices 12 may be in a binary format, including, e.g., the protocol buffers format. In another example, however, battery life data from mobile devices 12 may be in a text format, e.g. American Standard Code for Information Interchange (ASCII) text, including, e.g. Extensible Markup Language (XML) or JavaScript Object Notation (JSON).

In some examples, it may be necessary to process raw battery life data from one or more of mobile devices 12 into a form that represents the battery life of the device(s). For example, raw battery life data may include a number of entries in a log of mobile device 12A corresponding to a number of times, e.g. in a day, and including, e.g., a total percent charge of the device at each time or a discharged increment (e.g. 1%) from a previous time to a subsequent time. In one example, the raw battery life data collected by collection module 20 of battery life data processing engine 19 from mobile device 12A may include data corresponding to the battery charge depletion of the device(s) over a period of time. Battery life data processing engine 19 may, for example, process this raw battery life data from mobile device 12A to calculate an estimated battery life. In one example, battery life data processing engine 19 calculates an estimated battery life according to the following formula.

$$\text{Battery life} = 100 \cdot \left[ \frac{t_{end} - t_{start}}{L_{start} - L_{end}} \right]$$

In the foregoing formula, $t_{end}$ is the last time measurement included in the raw battery life data collected by collection module 20 of battery life data processing engine 19, $t_{start}$ is the first time measurement included in the raw battery life data, $L_{start}$ is the battery charge of mobile device 12A as a percentage of fully charged at $t_{start}$, and $L_{end}$ is the battery charge of the mobile device as a percentage of fully charged at $t_{end}$. In one example employing the foregoing formula, collection module 20 of battery life data processing engine 19 collects raw battery life data from mobile device 12A that includes a starting charge, $L_{start}$, of 80% at a first time, $t_{start}$, 1 pm and an ending charge, $L_{end}$, 60% at a last time, tend, 8 pm. In this example, battery life processing engine may calculate the estimated battery life of mobile device 12A as equal to 100*(8−1)/(80%−60%)=35 hours. In other words, the charge of the battery of mobile device 12A dropped 20% in 7 hours, from which it may be extrapolated that the battery of the device fully charged may last for approximately 35 hours.

After collecting the battery life data from mobile devices 12, server 18, and, in particular, correlation module 22 of battery life data processing engine 19 may then correlate the battery life data to one or more characteristics of the mobile devices, e.g. device model, software build, and one or more usage patterns. In one example, correlation module 22 employs a relational database that forms part or all of data repository 16 to correlate battery life data collected from mobile devices 12 to the device model and software build of each of the devices.

After collecting battery life data and correlating the data to one or more characteristics of mobile devices 12, aggregation module 24 of battery life data processing engine 19 may aggregate the battery life data based on one or more of the correlated characteristics. For example, aggregation module 24 may aggregate battery life data for all of mobile devices 12 with a common device model and/or a common software build. Aggregation module 24 may aggregate battery life data for any number of device models and software builds included in one or more of mobile devices 12. In addition to aggregating battery life data based on one or more characteristics of mobile devices 12, reporting module 26 of battery life data processing engine 19 may generate a report of the aggregated battery life data. For example, reporting module 26 may generate a report for the mobile devices including at least one of a common device model or common software build. In one example, the report generated by reporting module 26 may include a histogram that represents one or more proportions of mobile devices 12 including the common device model or common software build falling into one or more respective battery life ranges. Reports generated by reporting module 26 may include a variety of formats including, e.g., HTML, word processing document formats, spreadsheets, and the like.

In another example, aggregation module 24 may aggregate battery life data for all of mobile devices 12 including a common usage pattern. In such examples, reporting module 26 of battery life data processing engine 19 may also generate a report of the aggregated battery life data for mobile devices 12 including the common usage pattern. For example, reporting module 26 may generate a report including a linear regression of percentage of battery life versus time for mobile devices 12 including the common usage pattern.

Although the foregoing examples have been described with reference to battery life data processing engine 19 including collection module 20, correlation module 22, aggregation module 24, and reporting module 26, in other examples such processing engines or other mechanisms may be physically and/or logically differently arranged. For example, battery life data processing engine 19 may include a collection module, a correlation module, and an aggregation module, in which the aggregation module aggregates battery life data and generates reports of the aggregated data. A wide variety of other logical and physical arrangements are possible in order to implement the functionality attributed to the example of server 18 including battery life data processing engine 19 illustrated in FIGS. 1 and 2.

Figure 3:
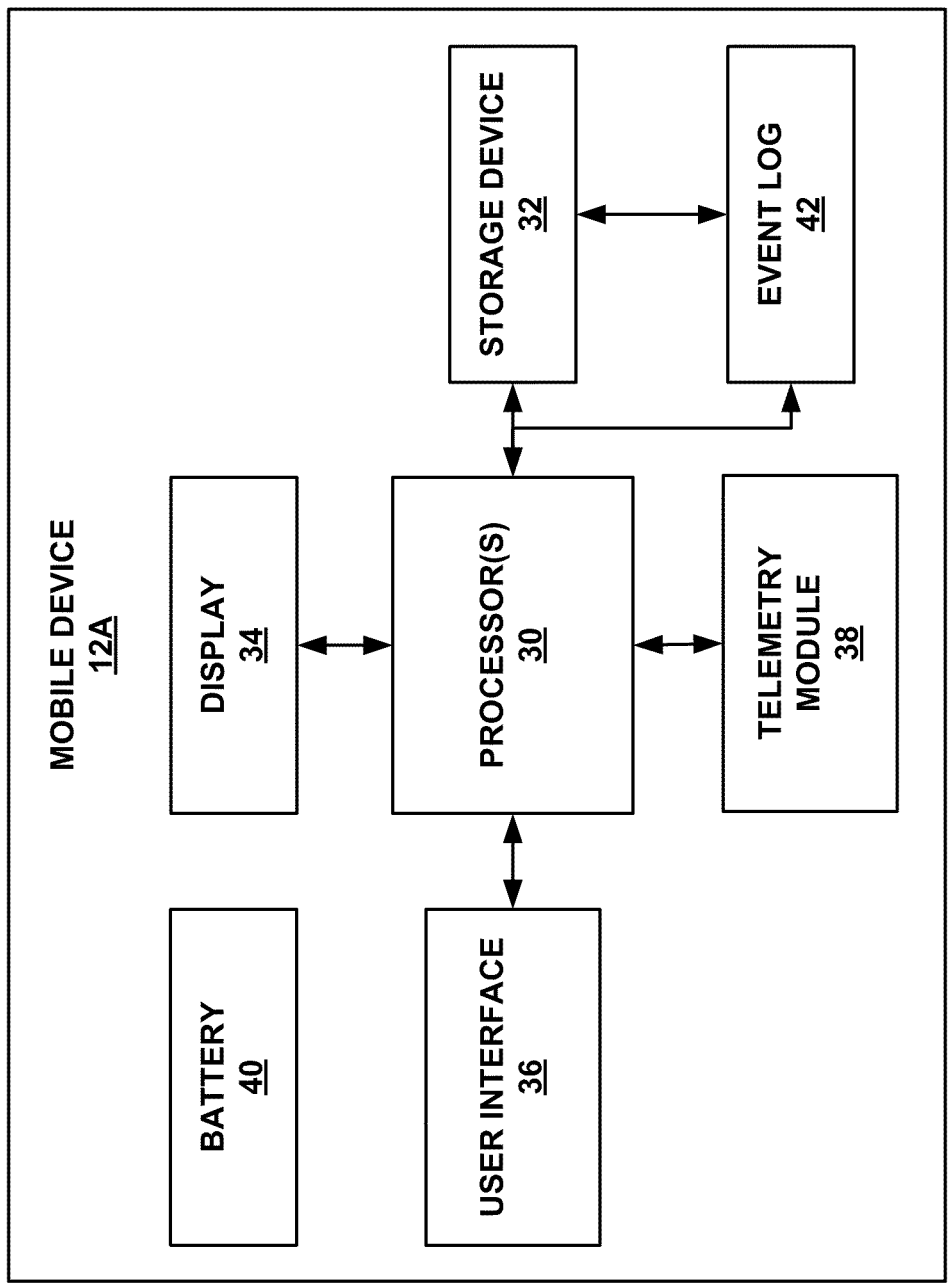
FIG. 3 is a block diagram illustrating an example mobile device of the system of FIG. 1.

FIG. 3 is a block diagram illustrating example mobile device 12A including processor 30, storage device 32, display 34, user interface 36, telemetry module 38, and battery 40. In examples where device 12 is a cellular phone, the device may also include a microphone and speaker (not shown) for voice communication. Processor 30, generally speaking, is communicatively connected to and controls operation of storage device 32, display 34, user interface 36, and telemetry module 38, all of which are powered by rechargeable battery 40. Processor 30 may include any one or more of a microprocessor, a controller, a digital signal processor (DSP), an application specific integrated circuit (ASIC), a field-programmable gate array (FPGA), or equivalent discrete or integrated logic circuitry. The functions attributed to processor 30 in this disclosure may be embodied as software, firmware, hardware and combinations thereof. Although example mobile 12 of FIG. 3 is illustrated as including one processor 30, other example mobile devices according to this disclosure may include multiple processors that are configured to execute one or more functions attributed to processor 30 of mobile device 12A individually or in different cooperative combinations.

Storage device 32 stores instructions for applications that may be executed by processor 30 and data used in such applications or collected and stored for use outside of mobile device 12A, e.g. battery life data. Storage device 32 may be a computer-readable, machine-readable, or processor-readable storage medium that comprises instructions that cause one or more processors, e.g., processor 30, to perform various functions. Storage device 32 may include any volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital media. Generally speaking, storage device 32 may include instructions that cause processor 30 to perform various functions attributed to the processor 10 in the disclosed examples.

Generally speaking, storage device 32 includes memory that stores software that may be executed by processor 30 to perform various functions for a user of mobile device 12A, including, e.g., making and receiving cellular telephone calls or other communications like text or e-mail messages, using various software applications, and browsing the Internet. The software included in mobile device 12A generally includes telemetry and other hardware drivers for the mobile device, operating system software, and applications software. The operating system software of mobile device 12A may be, e.g. Linux™ software or another UNIX based system software. In another example, mobile device 12A may include proprietary operating system software not based on an open source platform like UNIX. Mobile device 12A may also include various applications stored on storage device 32 and executed by processor 30, including, e.g., web browser, calendar, contact management, and e-mail applications, as well as various types of third-party vendor applications bundled with the device.

Operation of mobile device 12A may require, for various reasons, receiving data from one or more sources including, e.g. data repository 16 and server 18, as well as transmitting data from the mobile device, e.g. data stored on storage device 32 to one or more external sources, which may also include the data repository 16 and the server of system 10. For example, server 18 may be configured to contact each of mobile devices 12 via network 14 and instruct the device to transmit battery life data, as well as other data including the model and software build of the device and various usage patterns, to data repository 16 for temporary and/or permanent storage of all or a part of the mobile device data.

Data communications to and from mobile device 12A may therefore generally be handled by telemetry module 38. Telemetry module 38 is configured to transmit data/requests to and receive data/responses from one or more external sources via network 14. Telemetry module 38 may support various wireless communication techniques and protocols, and includes appropriate hardware and software to provide such communications. For example, telemetry module 38 may include an antenna, modulators, demodulators, amplifiers, and other circuitry to effectuate communication between mobile devices 12 and server 18 via network 14.

Mobile device 12A includes display 34, which may be, e.g., a liquid crystal display (LCD), light emitting diode (LED) display, e-ink, or other display. Display 34 presents the content of mobile device 12A to a user. For example, display 34 may present the applications executed on device 12 such as a web browser or a video game, as well as information about the mobile device, including, e.g., battery life and/or network signal strength. In some examples, display 34 may provide some or all of the functionality of user interface 36. For example, display 34 may be a touch screen that allows the user to interact with mobile device 12A. In generally, however, user interface 36 allows a user of mobile device 12A to interact with the device via one or more input mechanisms, including, e.g., an embedded keypad, a keyboard, a mouse, a roller ball, buttons, scroll wheel, touch pad, touch screen, or other devices or mechanisms that allow the user to interact with the device.

In some examples, user interface 36 may include a microphone to allow a user to provide voice commands. Users may interact with user interface 36 and/or display 34 to execute one or more of the applications stored on storage device 32. Some applications may be executed automatically by mobile device 12A, such as when the device is turned on or booted up. Processor 30 executes the one or more applications selected by a user, or automatically executed by mobile device 12A.

Battery 40 provides power for all if the various components of mobile device 12A, and may be rechargeable. Examples of battery 40 include a lithium polymer battery, a lithium ion battery, nickel cadmium battery, and a nickel metal hydride battery. The life of battery 40 of mobile device 12A depends on many factors. Generally speaking, e.g., the life of battery 40 is affected by loads on the battery caused by using either software or hardware components of mobile device. As different components of mobile device 12A, both different hardware and different software components, draw different amounts of power, the load on battery 40 may vary according to component usage patterns. For example, a backlight for display 34 may draw more power than an accelerometer such that the life of battery 40 of mobile device 12A may decrease significantly with increased backlight usage, while being less impacted by increased usage of the accelerometer. In another example, one system software build for mobile device 12A may generally require more power than another system software build.

In the example of FIG. 3, mobile device 12A also includes event log 42. Event log 42 may be, e.g., a binary log that is configured to temporarily store information related to the operation of mobile device 12A. Event log 42 may be implemented in a variety of manners, including, e.g., as buffer memory on storage device 32. In another example, however, event log 42 may include a separate storage device from storage device 32. In any event, event log 42 may, inter alia, be configured to store battery life data for rechargeable battery 40 of mobile device 12A. As described above, battery life data of mobile device 12A stored may be stored in event log 42 in a variety of formats, including, e.g., text or binary. In one example, processor 30 of mobile device 12A is preconfigured to execute a power manager service, which wakes up every time battery 40 discharges 1%. In other examples, processor 30 periodically checks the discharge of battery 40 in different manners, including, e.g. in larger or smaller discharge percentage increments or in time increments, such as every hour. Processor 30 may execute the power management service to write an event to event log 42 that may include, e.g., the time, current battery level, battery state (plugged-in to an AC/DC power source, on Universal Serial Bus (USB), discharging, failure, operating properly, etc.), and battery temperature. In one example, processor 30 may execute the power management service to write battery life data to event log 42, including, e.g., the charge of battery 40 and the time when the mobile device is removed from a power supply for charging, and again when it is attached to the charger. This battery life data may then be transmitted as one data record to, e.g., battery life data processing engine 19 of server 18, with the time and the drop in charge of battery 40 of mobile device 12A.

Although described above as executed by battery life data processing engine 19, in some examples, processor 30 of mobile device 12A may process raw battery life data, e.g., stored in event log 42. In one example, the raw battery life data stored in event log 42 may include data corresponding to the battery charge depletion of the device(s) over a period of time. Processor 30 of mobile device 12A may process this raw battery life data to calculate an estimated battery life of the device according to the formula described above with reference to FIG. 2.

In addition to battery life data, processor 30 may also execute the power management service, or another software routine or algorithm included in mobile device 12A, e.g.

stored on storage device 32, to write usage patterns to event log 42. For example, processor 30 may track and record the amount of time mobile device 12A is awake over a certain period of time or the amount of time display 34 is on during the period. An "awake" state of mobile device 12A generally refers to one of multiple power modes of the device in which processor 30, and/or another processor of the device is powered on to execute one or more functions. Processor 30 may also track data related to the number of times mobile device 12A synchronizes with one or more other devices or applications, e.g. synchronizations with e-mail, contacts, or other databases, or the number of times mobile device 12A logs particular types of errors, including, e.g. the number of times an application does not respond (application not responding error, or, ANR), e.g. due to a crash. Processor 30 may also track particular actions performed by mobile device 12A, including, e.g., the number of times the device attempts to join an external network, such as a wireless network over a particular period of time. In some examples, these and other usage patterns may be correlated to the battery life of battery 40 of mobile device 12A.

As noted above with reference to FIG. 1, mobile device 12A may cooperate with a service on an external server by which the server periodically contacts the mobile device via a network and instructs the device to transmit battery life data, as well as other data including the model and software build of the device and various usage patterns, to a data repository for temporary and/or permanent storage of all or a part of the mobile device data. For example, with reference to system 10 of FIG. 1, battery life data processing engine 19 of server 18 may periodically, e.g. once every hour, may contact mobile device 12A via network 14 and request the device transmit event log 42 to data repository 16. Additionally, mobile device 12A may automatically send battery life data to data repository 16 via telemetry module 38 without waiting for a request from battery life data processing engine 19.

As noted above, in some examples, battery life data processing engine 19 may process raw battery life data from mobile device 12A. For example, the raw battery life data collected by collection module 20 of battery life data processing engine 19 from mobile device 12A may include the charge of battery 40 and the time when the mobile device is removed from a power supply for charging, and again when it is attached to the charger. Battery life data processing engine 19 may, for example, process this raw battery life data from mobile device 12A to calculate an estimated battery life. In one example, battery life data processing engine 19 calculates an estimated battery life as a function of the charge ($L_{start}$) of battery 40 and the time ($t_{start}$) when mobile device 12A is removed from a power supply for charging, and the charge ($L_{end}$) of battery 40 and the time ($t_{end}$) when it is attached to the charger, e.g. according to the following set forth above with reference to FIG. 2.

After battery life data is collected from mobile device 12A, and, in some examples, processed, battery life data processing engine 19 may then correlate the battery life data in event log 42 of mobile device 12A to one or more characteristics of the device, e.g. device model, software build, and one or more usage patterns. Although server 18 may generally be configured to contact mobile device 12A via network 14 on a periodic bases, in some examples, an extra check-in may be added adaptively if battery 40 is near end-of-life. Such a function may be implemented because battery 40 may deplete too rapidly such that it becomes discharged before the next scheduled check-in resulting in loss of battery life data on event log 42, which may be volatile.

Although mobile device 12A of FIG. 3 is shown as including display 34, aspects of this disclosure should not be considered limited to example mobile devices that include a display. In some examples of mobile device 12A, display 34 may be optional. For example, in some examples in which mobile device 12A is a music player or a radio, the device may not include a display.

Figure 4:
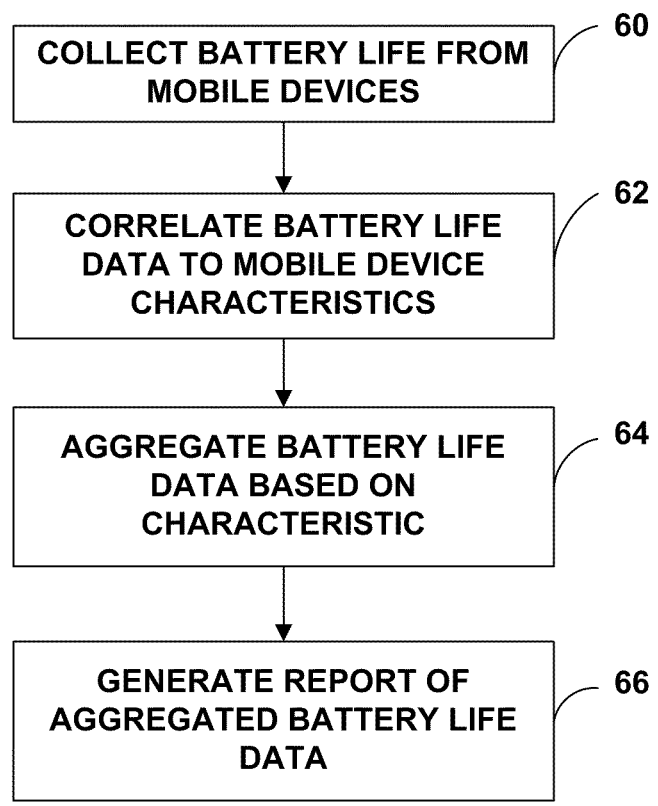
FIG. 4 is a flowchart illustrating an example method of aggregating battery life data from a number of mobile devices.

FIG. 4 is a flowchart illustrating an example method of aggregating battery life data from a number of mobile devices. The method of FIG. 4 includes collecting battery life data from a plurality of mobile devices (60), correlating the battery life data for each of the mobile devices with one or more characteristics of each of the mobile devices (62), aggregating the battery life data for the mobile devices based on at least one of the one or more characteristics (64), and generating a report of the aggregated battery life data for a number mobile devices including at least one common characteristic (66). The functions of the method of FIG. 4 for aggregating battery life data from a number of mobile devices are described below as carried out by various components of example system 10 of FIG. 1 for purposes of illustration only. However, in other examples, one or more of the functions of the method of FIG. 4 may be carried out by other devices or systems that differ from system 10 in constitution and arrangement. For example, instead of configuring data repository 16 and server 18 including data processing engine 19 as separate connected devices, in another example, the functions attributed to the server and the data repository may be implemented in a single device, e.g. a server including both a data processing engine and a data repository.

The method of FIG. 4 includes server 18 collecting battery life data from mobile devices 12 (60) via network 14. In one example, server 18 includes battery life data processing engine 19 that is configured to periodically contact each of mobile devices 12. Data processing engine 19 or another component of server 18 may function to collect data from mobile devices 12, as well as push data to the devices. For example, data processing engine 19 running on server 18 may contact each of mobile devices once every hour via network 14 and instruct the devices to transmit battery life data, as well as other data including the model and software build of the device and various usage patterns, to data repository 16 for temporary and/or permanent storage of all or a part of the mobile device data. In the configuration of example mobile device 12A of FIG. 3, battery life data processing engine 19 may request that each of the mobile devices transmit an event log including battery life data to data repository 16 via network 14.

In some examples, the method of FIG. 4 may also include processing raw battery life data from, e.g., one or more of mobile devices 12 into a form that represents the battery life of the device(s). For example, raw battery life data may include a number of entries in event log 42 of mobile device 12A corresponding to a number of times, e.g. in a day, and including, e.g., a total percent charge of the device at each time or a discharged increment (e.g. 1%) from a previous time to a subsequent time. In one example, the raw battery life data collected by collection module 20 of battery life data processing engine 19 from event log 42 of mobile device 12A may include data corresponding to the battery charge depletion of the device(s) over a period of time. Battery life data processing engine 19 may, for example, process this raw battery life data from event log 42 mobile device 12A to calculate an estimated battery life. In one example, battery life data processing engine 19 calculates an estimated battery life according to the following formula.

$$\text{Battery life} = 100 \cdot \left[\frac{t_{end} - t_{start}}{L_{start} - L_{end}}\right]$$

In the foregoing formula, $t_{end}$ is the last time measurement included in the raw battery life data collected by collection module 20 of battery life data processing engine 19, $t_{start}$ is the first time measurement included in the raw battery life data, $L_{start}$ is the battery life of mobile device 12A as a percentage of fully charged at $t_{start}$, and $L_{end}$ is the battery life of the mobile device as a percentage of fully charged at $t_{end}$. In one example employing the foregoing formula, collection module 20 of battery life data processing engine 19 collects raw battery life data from event log 42 of mobile device 12A that includes a starting charge, $L_{start}$, of 80% at a first time, $t_{start}$, 1 pm and an ending charge, $L_{end}$, 60% at a last time, $t_{end}$, 8 pm. In this example, battery life processing engine may calculate the estimated battery life of mobile device 12A as equal to 100*(8−1)/(80%−60%)=35 hours. In other words, the charge of the battery of mobile device 12A dropped 20% in 7 hours, from which it may be extrapolated that the battery of the device fully charged may last for approximately 35 hours.

Referring again to FIG. 4, the example method also includes correlating the battery life data for each of mobile devices 12 with one or more characteristics of each of the devices (62). In one example, battery life data processing engine 19 may correlate the battery life data collected from mobile devices 12 via network 14 to one or more characteristics of the devices, e.g. device model, software build, and one or more usage patterns. For example, battery life data processing engine 19 employs a relational database that forms part or all of data repository 16 to correlate battery life data collected from mobile devices 12 to the device model and software build of each of the devices. In such an example, battery life data processing engine 19 associates battery life data for each mobile device 12 with the device model and software build such that the relational database of data repository 16 is populated with records that may be indexed by one or both of device model and software build. In one example, battery life data is correlated separately for each of device model and software build of mobile devices 12.

Additionally, in some examples, battery life data processing engine 19 of server 18 may correlate battery life data for each mobile device 12 with usage patterns, including, e.g., the amount of time each mobile device 12 is awake over a certain period of time, the amount of time a display of the device is on during the period, the number of times mobile device 12 synchronizes with one or more other devices or applications (e.g. e-mail, contacts, etc.), the number of times mobile device 12 logs particular types of errors, e.g. the number of times an application is not responding (ANR), or the number of times the device attempts to join an external network, such as a wireless network over a particular period of time.

The method of FIG. 4 also includes battery life data processing engine 19 of server 18 aggregating the battery life data for mobile devices 12 based on at least one of the one or more characteristics of the devices (64). In one example, data processing engine 19 may aggregate battery life data for all of mobile devices 12 with a common device model and/or a common software build. Data processing engine 19 may aggregate battery life data for any number of device models and software builds included in one or more of mobile devices 12. In addition to aggregating battery life data based on one or more characteristics of mobile devices 12, battery life data processing engine 19 may generate a report of the aggregated battery life data. For example, as noted above, data processing engine 19 may associate battery life data for each mobile device 12 with the device model and software build such that a relational database of data repository 16 is populated with records that may be indexed by one or both of device model and software build. In such an example, data processing engine 19 may control the database of repository 16 to aggregate battery life data in a table such that the table represents, e.g., the battery life data for all of mobile devices 12 with a particular device model. Similarly, battery life data processing engine 19 may control the database of repository 16 to aggregate battery life data in a table such that the table represents, e.g., the battery life data for all of mobile devices 12 with a particular software build.

In some examples, the method of FIG. 4 may include generating a report of the aggregated battery life data for mobile devices 12 including at least one common characteristic (66). For example, battery life data processing engine 19 of server 18 may generate a report for mobile devices 12 including at least one of a common device model or common software build. In one example, the report generated by data processing engine 19 may include a histogram that represents one or more proportions of mobile devices 12 including the common device model or common software build falling into one or more respective battery life ranges. In another example, data processing engine 19 may generate a report of aggregated battery life data for mobile devices 12 including a common usage pattern. For example, data processing engine 19 may generate a report including a linear regression of percentage of battery life versus time for mobile devices 12 including the common usage pattern, such as, e.g., a number of ANRs per hour or a number of wireless network connection attempts per hour.

A method for aggregating battery life data for a number of mobile devices in accordance with the example of FIG. 4 was conducted on a system similar to the example of FIG. 1 and with mobile devices in accordance with the example of FIG. 3, in one working example. In the test battery life aggregation study of this working example, non-consumer test users were employed to use a variety of mobile devices with different models and software builds. As the users involved in the study were not consumers and were employed, inter alia, for the study, the type and amount of device data and usage patterns that was collected from the users' mobile devices was not a significant concern. However, as noted above, in some examples, it may be appropriate to configure the battery life collection system such that users may opt-in or opt-out of data collection from or data transmission to their mobile device. Some results gleaned from the study of battery life aggregation are presented in FIGS. 5-11.

Figure 5:
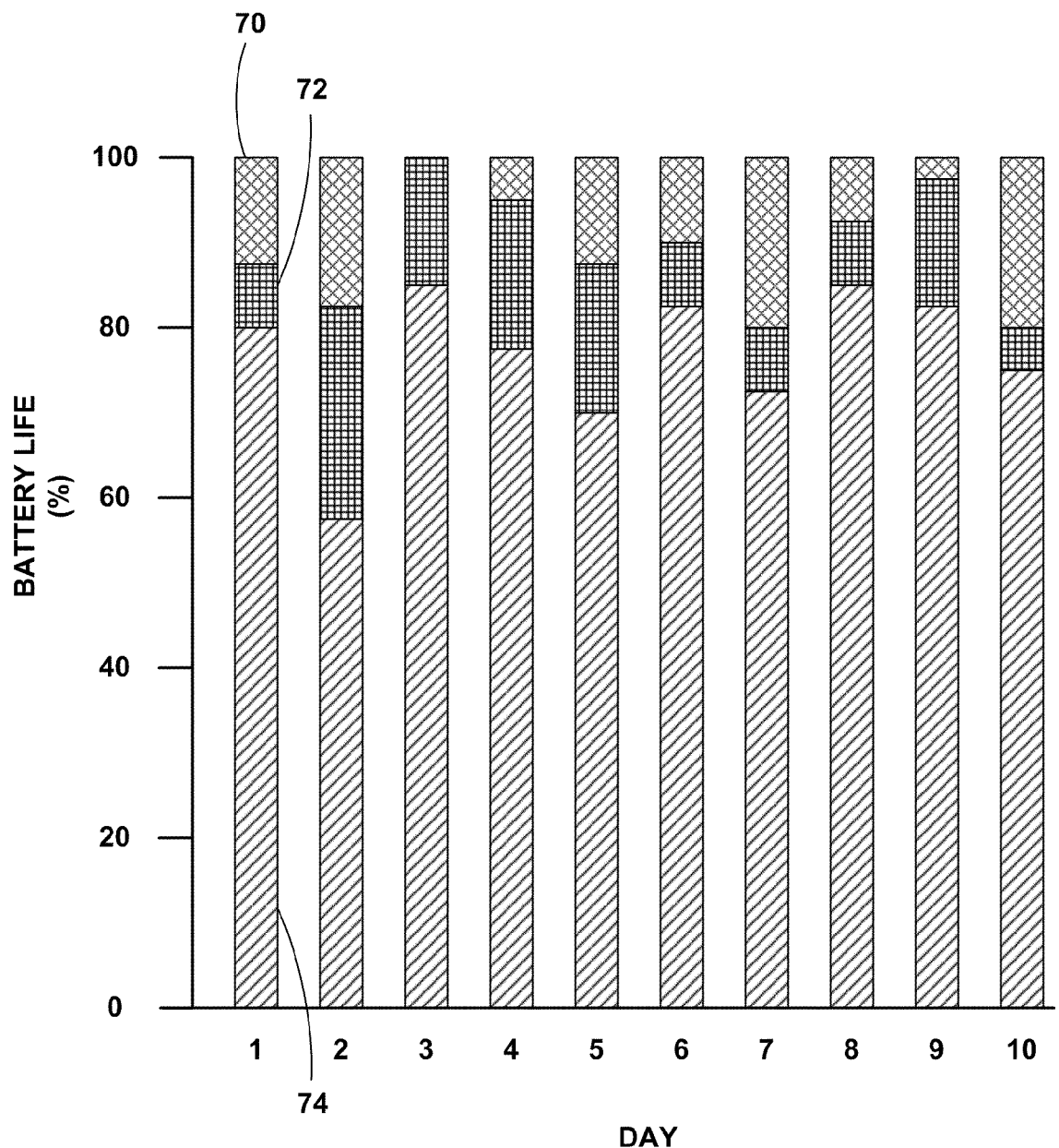
FIG. 5 is an example histogram that represents one or more proportions of a number of test users' mobile devices that include a common device model falling into three respective battery life ranges.

FIG. 5 is an example histogram that represents one or more proportions of a number of the test users' mobile devices that include a common device model falling into three respective battery life ranges. The histogram data of FIG. 5 is presented over ten days, during each of which the proportion of test users' devices falling into the three battery life ranges varies. Each of the three battery life ranges in FIG. 5 are represented by a different pattern. Battery life range 70 is represented by angular cross-hatching and corresponds to battery lives less than approximately 12 hours. Battery life range 72 is represented by straight cross-hatching and corresponds to battery lives in a range from approximately 12 hours to approximately 24 hours. Battery life range 74 is represented by angular section lines and corresponds to battery lives in greater than approximately 24 hours. By comparing the example of FIG. 5 to a number of other similar histograms for users' mobile devices with different common device models, the battery life performance of a number of mobile device models may be determined or estimated. Additionally, although the example histogram report of FIG. 5 represents a number of the test users' mobile devices that include a common device model, a similar report may be generated for a number of devices that include, e.g., a common software build.

Figure 6:
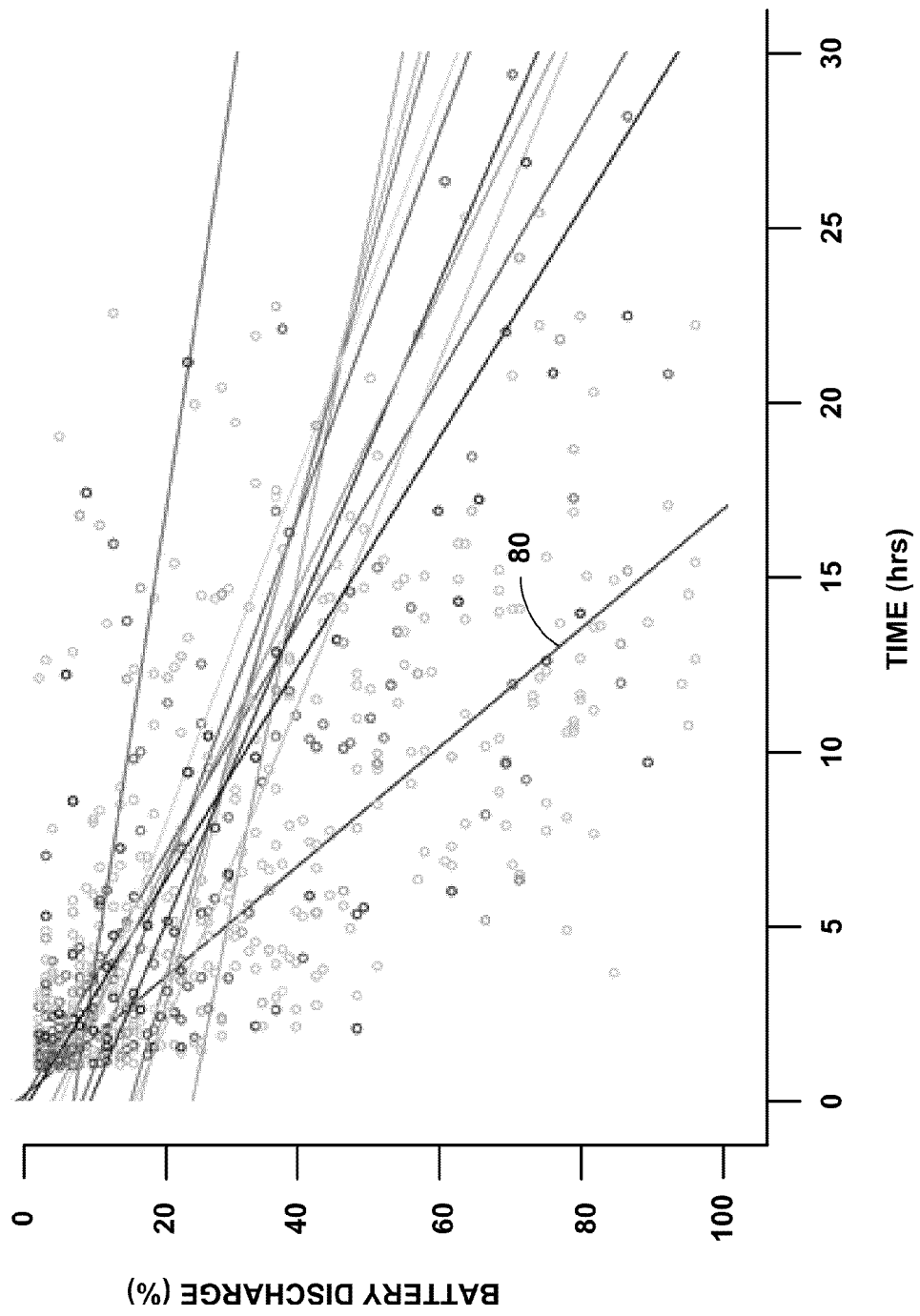
FIG. 6 is an example scatter plot with linear regression that represents the battery life data of a number of test users' mobile devices with a number of common software builds.

FIG. 6 is an example scatter plot that represents the battery life data of a number of test users' mobile devices with a number of common software builds. In fact, battery life data for twelve different device software builds are represented in the example of FIG. 6. FIG. 6 also includes a linear regression for the battery life data for each of the software builds such that the battery life for all the devices with each of the twelve common software builds is represented by a line. The battery life performance of each of the software builds illustrated in FIG. 6 may be quickly analyzed by, e.g., observing the slope of the linear regression associated with each software build. Steeper lines generally correspond to users' mobile devices that discharged more quickly. For example, linear regression line 80 in FIG. 6 corresponded to the users' mobile devices with a common software build that discharged the most rapidly of the different software builds represented in the example. It should be noted that software build is not the only factor affecting battery life and, as such, the data represented by FIG. 6 may not be conclusive as to battery life performance of the various software builds. Although FIG. 6 shows battery life data over an approximately 30 hour period, in other examples, historical trend reports that show battery life of one or more devices with one or more configurations over multiple days may also be generated.

Figure 7:
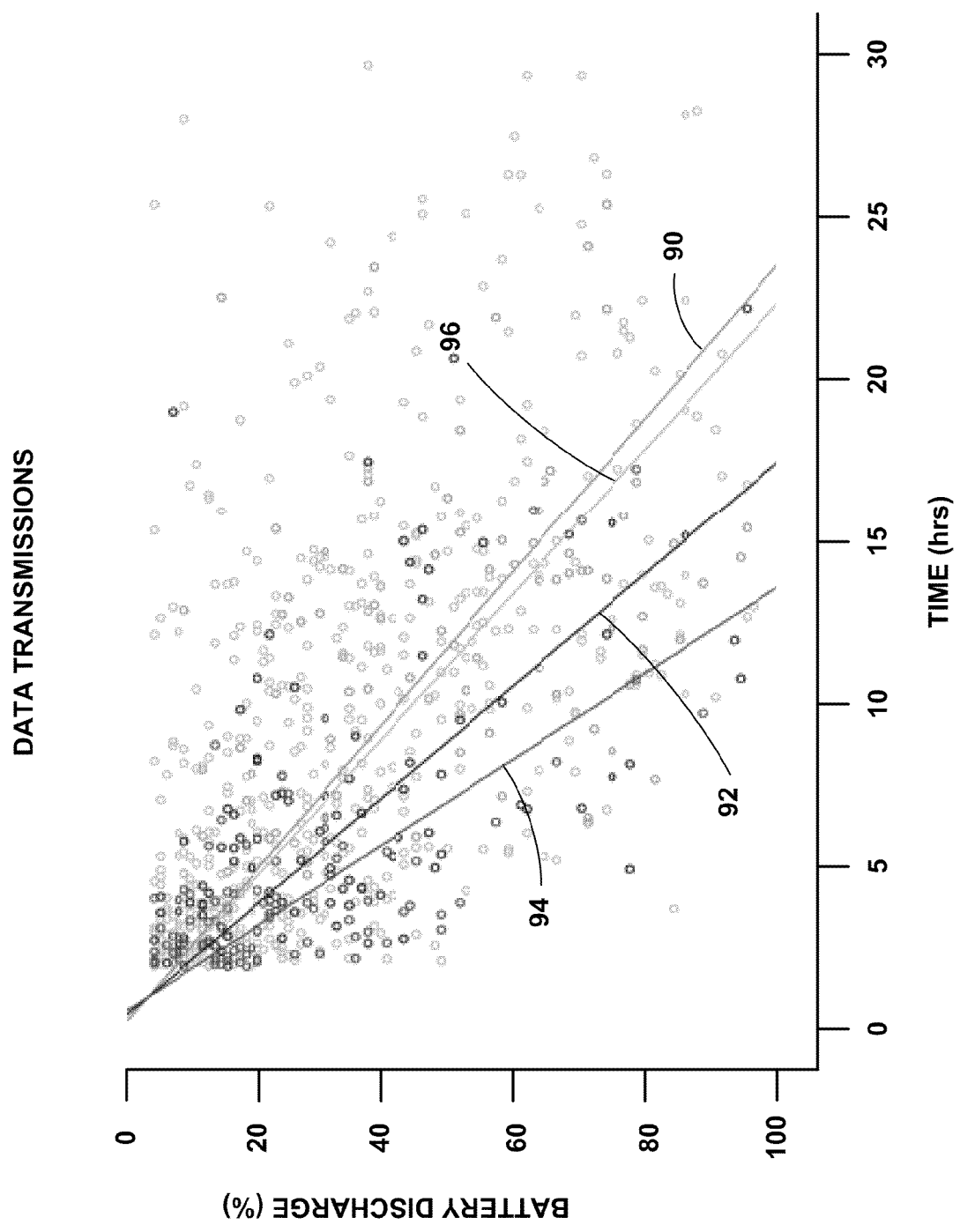
FIG. 7 is an example scatter plot with linear regressions that represents the battery life data of a number of test users' mobile devices aggregated based on the amount of network traffic for each of the devices over a data collection period.

FIGS. 7-11 are example scatter plots with linear regressions that represent the battery life data of a number of test users' mobile devices aggregated based on a number of different usage patterns. For example, FIG. 7 is a scatter plot with linear regressions that represents the battery life data of a number of test users' mobile devices aggregated based on the amount of network traffic for each of the devices over the data collection period. In the example of FIG. 7, the test users' mobile devices are aggregated into three different levels of network data traffic, which are represented by lines 90, 92, and 94. Line 96 represents users' mobile devices with no or negligible network data traffic. Battery life data for test users' mobile devices with low network data traffic levels, e.g. less than approximately 374 kilobytes per hour, is represented by linear regression line 90. Battery life data for test users' mobile devices with medium network data traffic levels, e.g. in a range from approximately 374 kilobytes per hour to approximately 1416 kilobytes per hour, is represented by linear regression line 92. Battery life data for test users' mobile devices with high network data traffic levels, e.g. greater than approximately 1416 kilobytes, is represented by linear regression line 94.

Figure 8:
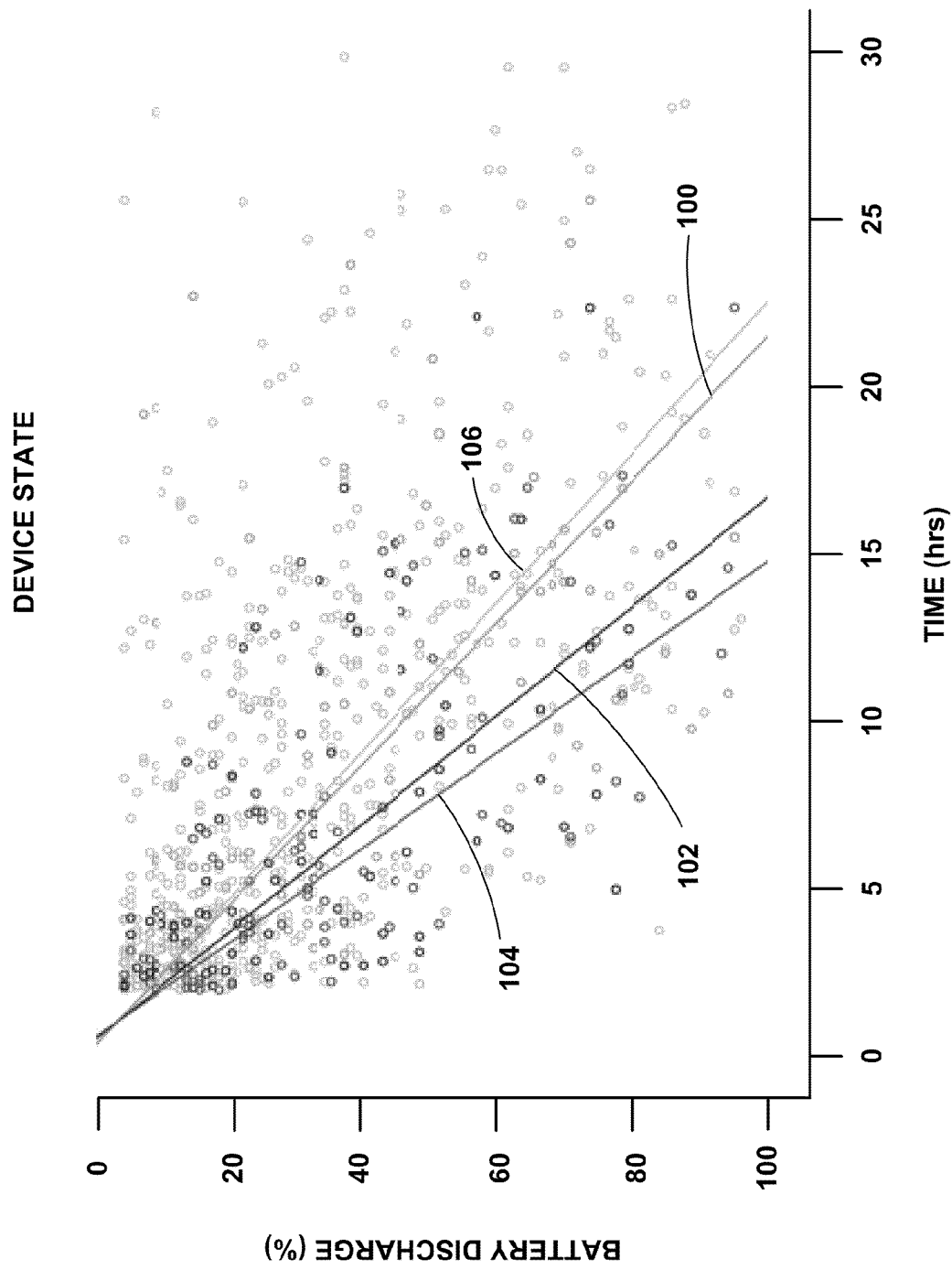
FIG. 8 is an example scatter plot with linear regressions that represents the battery life data of a number of test users' mobile devices aggregated based on the amount of time each of the devices were awake over a data collection period.

In another example, FIG. 8 is a scatter plot with linear regressions that represents the battery life data of a number of test users' mobile devices aggregated based on the amount of time each of the devices were awake over the data collection period. In the example of FIG. 8, the test users' mobile devices are aggregated into three different percentages of time awake, which are represented by lines 100, 102, and 104. Line 106 represents test users' mobile devices with zero or negligible time awake percentages. Battery life data for test users' mobile devices with a time awake percentage that was less than approximately 15% awake time is represented by linear regression line 100. Battery life data for test users' mobile devices with a time awake percentage that was in a range from approximately 15% awake time to approximately 24% awake time is represented by linear regression line 102. Battery life data for test users' mobile devices with a time awake percentage that was greater than approximately 24% awake time is represented by linear regression line 104.

Figure 9:
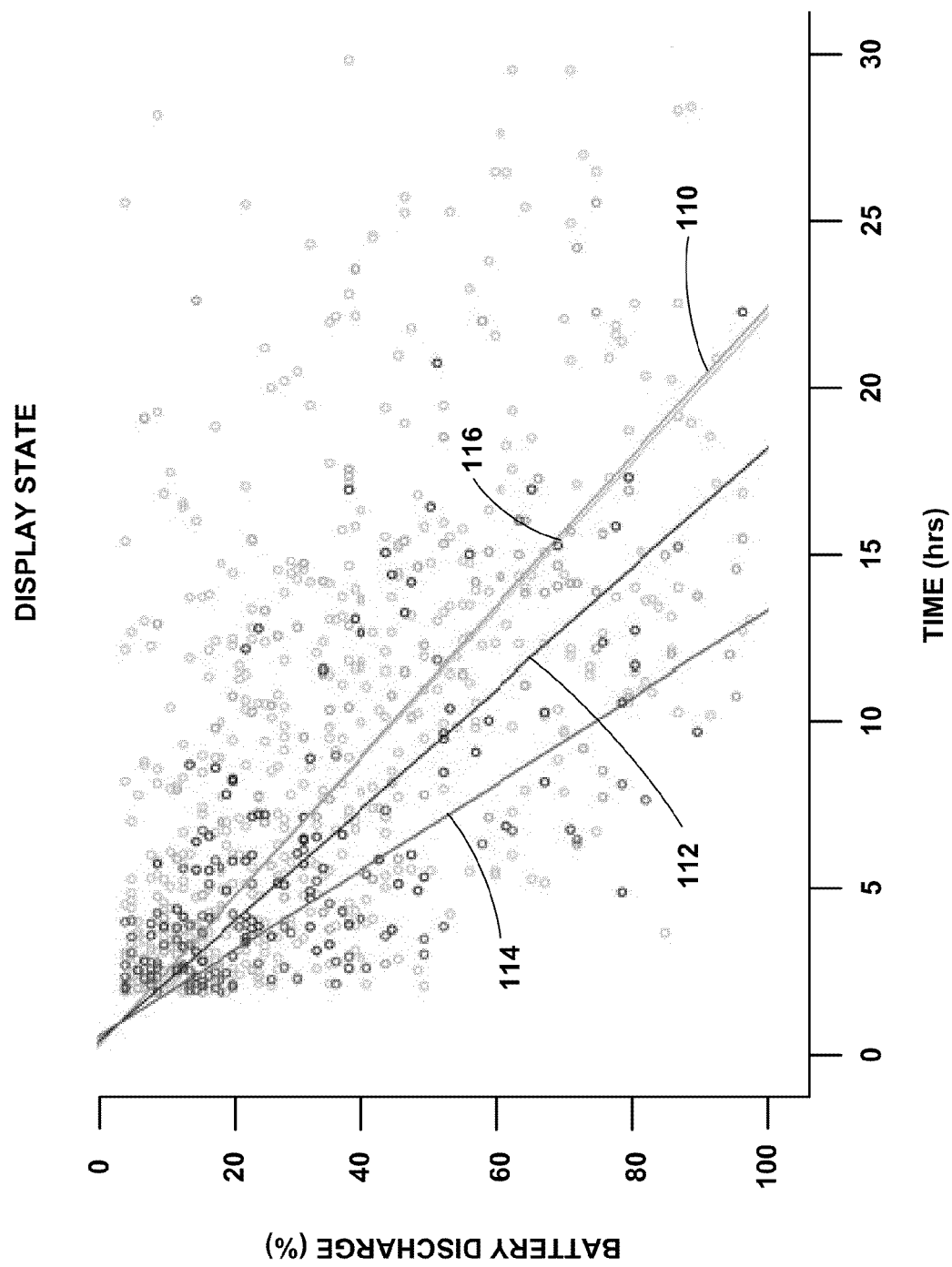
FIG. 9 is an example scatter plot with linear regressions that represents the battery life data of a number of test users' mobile devices aggregated based on the amount of time each of the devices displays were on over a data collection period.

FIG. 9 is an example scatter plot with linear regressions that represents the battery life data of a number of test users' mobile devices aggregated based on the amount of time each of the devices displays were on over the data collection period. In the example of FIG. 9, the test users' mobile devices are aggregated into three different percentages of display time on, which are represented by lines 110, 112, and 114. Line 116 represents test users' mobile devices with zero or negligible display on percentages. Battery life data for test users' mobile devices with a display time on percentage that was less than approximately 0.06% display on time is represented by linear regression line 110. Battery life data for test users' mobile devices with a display time on percentage that was in a range from approximately 0.06% display on time to approximately 0.19% is represented by linear regression line 112. Battery life data for test users' mobile devices with a display time on percentage that was greater than approximately 0.19% display on time is represented by linear regression line 114.

Figure 10:
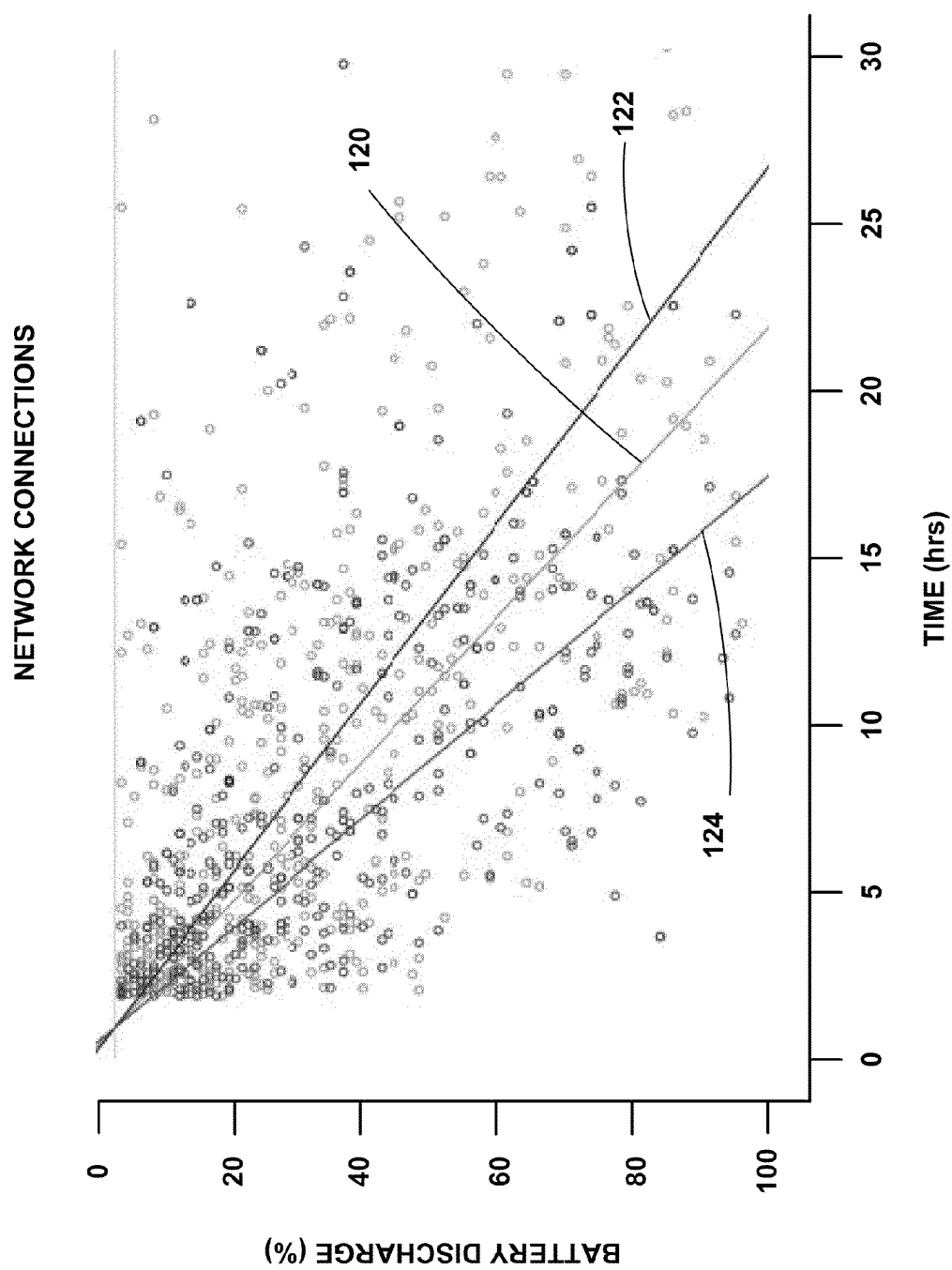
FIG. 10 is an example scatter plot with linear regressions that represents the battery life data of a number of test users' mobile devices aggregated based on the number of times the devices connected to or attempted to connect to an external wireless network per hour.

In another example, FIG. 10 is a scatter plot with linear regressions that represents the battery life data of a number of test users' mobile devices aggregated based on the number of times the devices connected to or attempted to connect to an external wireless network, e.g., a WI-FI® network, per hour. In the example of FIG. 10, the test users' mobile devices are aggregated into three different ranges of number of wireless network connects per hour, which are represented by lines 120, 122, and 124. Battery life data for test users' mobile devices with zero wireless network connects per hour is represented by linear regression line 120. Battery life data for test users' mobile devices with wireless network connects per hour in a range from approximately zero to approximately 13 is represented by linear regression line 122. Battery life data for test users' mobile devices with more than approximately 13 wireless network connects per hour is represented by linear regression line 124.

Figure 11:
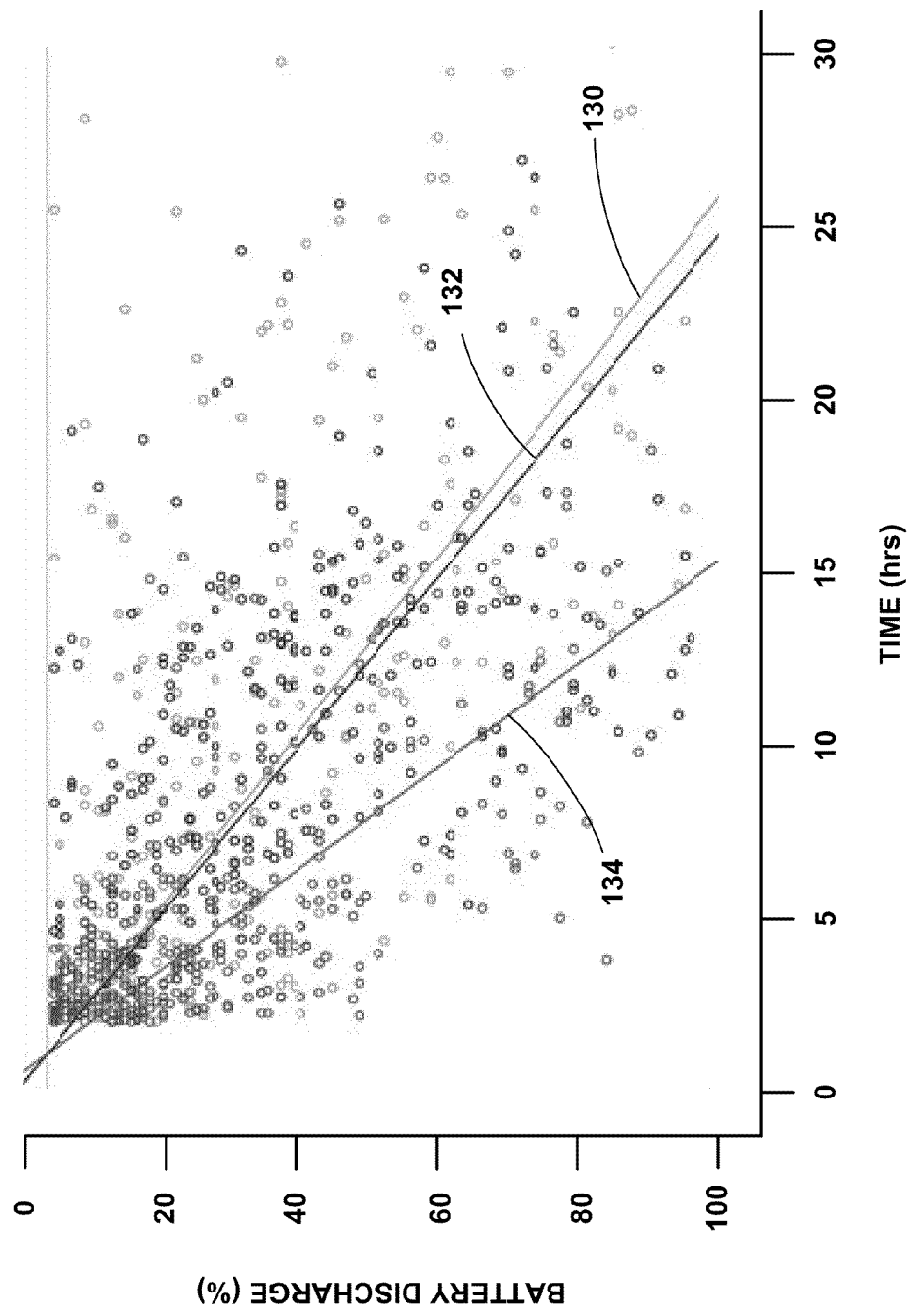
FIG. 11 is an example scatter plot with linear regressions that represents the battery life data of a number of test users' mobile devices aggregated based on the number of times the devices synchronized e-mail accounts per hour.

FIG. 11 is an example scatter plot with linear regressions that represents the battery life data of a number of test users' mobile devices aggregated based on the number of times the devices synchronized e-mail accounts per hour. In the example of FIG. 11, the test users' mobile devices are aggregated into three ranges of e-mail synchronizations per hour, which are represented by lines 130, 132, and 134. Battery life data for test users' mobile devices with less than or equal to 1 e-mail synchronization per hour is represented by linear regression line 130. Battery life data for test users' mobile devices with e-mail synchronizations per hour in a range from approximately 1 to approximately 7 is represented by linear regression line 132. Battery life data for test users' mobile devices with more than approximately 7 e-mail synchronizations per hour is represented by linear regression line 134.

A number of conclusions were extrapolated from the results of the various battery life data aggregations performed as part of the study of this particular, yet non-limiting, example described above. As an example, it is believed that for certain device models and software builds, the number of e-mail synchronizations and the number of wireless network connections per hour has a significant impact on battery life. As a result of this discovery, the synchronizations and/or network connection processes may be modified to prolong battery line. For example, instead of downloading and processing e-mail data simultaneously, all the data may first be downloaded and then be processed. This enables the antenna of the mobile device to operate in a lower power state for longer, which, in turn, may act to decrease the load on the device battery and thereby increase battery life.

The foregoing examples provide example techniques for collecting battery life for a large number of mobile devices (e.g., mobile phones), correlating that battery life data to different characteristics of the devices, and aggregating the battery life data based on the correlations. Understanding average battery life and battery life distributions of for large sets of devices may have a number of benefits including detecting software release regressions and particular usage patterns that may impact battery life, both of which may be used to improve battery life in future releases of a device.

Although the foregoing examples are described with reference to mobile devices including rechargeable batteries as power sources, the disclosed techniques may be applied to power consumption in general in which such mobile devices employ alternative power sources. As such, instead of collecting, correlating, and aggregating battery life data from a number of mobile devices, the disclosed techniques may be employed more generally to collect, correlate, and aggregate power source data from a number of mobile devices. Examples of alternative power sources that may be employed in mobile devices include fuel cells, super capacitors, non-rechargeable batteries, solar cells, and any other power source configured to power a mobile device.

The techniques described in this disclosure may be implemented, at least in part, in hardware, software, firmware or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

The techniques described in this disclosure may also be embodied or encoded in a computer-readable medium, such as a computer-readable storage medium, containing instructions. Instructions embedded or encoded in a computer-readable medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

Various examples have been described. These and other examples are within the scope of the following claims.

The invention claimed is:

1. A method comprising:
collecting battery life data from each of a plurality of mobile devices, wherein the battery life data for each of the mobile devices is tracked by each respective mobile device;
correlating, by a computing device, the battery life data collected from each of the mobile devices with one or more characteristics of each of the mobile devices;
aggregating, by the computing device, the battery life data collected from each of the mobile devices based on at least one of the one or more characteristics; and
calculating an estimated battery life for each of the mobile devices based on the battery life data collected from each of the mobile devices,
wherein the estimated battery life is equal to 100 multiplied by a ratio of a difference between a last time included in the battery life data and a first time included in the battery life data to a difference between a battery charge as a percentage of fully charged at the first time and a battery charge as a percentage of fully charged at the last time.

2. The method of claim 1, wherein the one or more characteristics comprise at least one of device model and software build.

3. The method of claim 2, wherein aggregating the battery life data comprises aggregating battery life data for all of the mobile devices comprising at least one of a common device model and a common software build.

4. The method of claim 3, further comprising generating a report of the aggregated battery life data collected from each of the mobile devices comprising at least one of the common device model and the common software build.

5. The method of claim 4, wherein the report comprises a histogram that represents one or more proportions of the mobile devices comprising at least one of the common device model and the common software build falling into one or more respective battery life ranges.

6. The method of claim 1, wherein the one or more characteristics comprises at least one usage pattern.

7. The method of claim 6, wherein the at least one usage pattern comprises at least one of an amount of network data traffic over a time period, an amount of time the mobile device is in a first state over a time period, a number of external network connection attempts over a time period, a number of application errors over a time period, a number of application synchronizations over a time period, or an amount of time a display of the mobile device is on over a period of time.

8. The method of claim 6, wherein aggregating the battery life data comprises aggregating the battery life data for all of the mobile devices comprising a common usage pattern.

9. The method of claim 8, further comprising generating a report of the aggregated battery life data for the mobile devices comprising the common usage pattern.

10. The method of claim 9, wherein the report comprises a linear regression of percentage of battery life versus time for the mobile devices comprising the common usage pattern.

11. A system comprising:
a non-transitory computer-readable storage medium storing a database configured to store battery life data collected from each of a plurality of mobile devices via a communication network, wherein the battery life data for each of the mobile devices is tracked by each respective mobile device; and one or more processors configured to:
- correlate the battery life data collected from each of the mobile devices with one or more characteristics of each of the mobile devices;
- aggregate the battery life data collected from each of the mobile devices based on at least one of the one or more characteristics; and
- calculate an estimated battery life for each of the mobile devices based on the battery life data collected from each of the mobile devices, wherein the estimated battery life is equal to 100 multiplied by a ratio of a difference between a last time included in the battery life data and a first time included in the battery life data to a difference between a battery charge as a percentage of fully charged at the first time and a battery charge as a percentage of fully charged at the last time.

12. The system of claim 11, wherein the one or more characteristics comprise at least one of device model and software build.

13. The system of claim 12, wherein the one or more processors are configured to aggregate battery life data for all of the mobile devices comprising at least one of a common device model and a common software build.

14. The system of claim 13, wherein the one or more processors are configured to generate a report of the aggregated battery life data for the mobile devices comprising at least one of the common device model and the common software build.

15. The system of claim 14, wherein the report comprises a histogram that represents one or more proportions of the mobile devices comprising at least one of the common device model and the common software build falling into one or more respective battery life ranges.

16. The system of claim 11, wherein the one or more characteristics comprises at least one usage pattern.

17. The system of claim 16, wherein the at least one usage pattern comprises at least one of an amount of network data traffic over a time period, an amount of time the mobile device is in a first state over a time period, a number of external network connection attempts over a time period, a number of application errors over a time period, a number of application synchronizations over a time period, and an amount of time a display of the mobile device is on over a period of time.

18. The system of claim 16, wherein the one or more processors are configured to aggregate battery life data for all of the mobile devices comprising a common usage pattern.

19. The system of claim 18, wherein the one or more processors are configured to generate a report of the aggregated battery life data for the mobile devices comprising the common usage pattern.

20. The system of claim 19, wherein the report comprises a linear regression of percentage of battery life versus time for the mobile devices comprising the common usage pattern.

21. A non-transitory computer readable storage medium comprising instructions for causing a programmable processor to:
- collect battery life data from each of a plurality of mobile devices, wherein the battery life data for each of the mobile devices is tracked by each respective mobile device;
- correlate the battery life data collected from each of the mobile devices with one or more characteristics of each of the mobile devices;
- aggregate the battery life data collected from each of the mobile devices based on at least one of the one or more characteristics; and
- calculate an estimated battery life for each of the mobile devices based on the battery life data collected from each of the mobile devices, wherein the estimated battery life is equal to 100 multiplied by a ratio of a difference between a last time included in the battery life data and a first time included in the battery life data to a difference between a battery charge as a percentage of fully charged at the first time and a battery charge as a percentage of fully charged at the last time.

* * * * *